US006933595B2

(12) United States Patent
Reiss et al.

(10) Patent No.: US 6,933,595 B2
(45) Date of Patent: Aug. 23, 2005

(54) ELECTRONIC DEVICE AND LEADFRAME AND METHODS FOR PRODUCING THE ELECTRONIC DEVICE AND THE LEADFRAME

(75) Inventors: Martin Reiss, Regensburg (DE); Jürgen Zacherl, Donaustauf (DE)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 10/325,251

(22) Filed: Dec. 19, 2002

(65) Prior Publication Data

US 2003/0111719 A1 Jun. 19, 2003

(30) Foreign Application Priority Data

Dec. 19, 2001 (DE) ........................................ 101 62 676

(51) Int. Cl.[7] .............................................. H01L 23/495

(52) U.S. Cl. ....................... 257/676; 257/684; 257/787; 438/597

(58) Field of Search ................................ 438/126, 127, 438/597; 257/676, 684, 787

(56) References Cited

U.S. PATENT DOCUMENTS 5,064,706 A * 11/1991 Ueda et al. ................. 428/131
5,150,193 A * 9/1992 Yasuhara et al. ........... 257/669
5,182,853 A * 2/1993 Kobayashi et al. ........... 29/841
5,847,446 A 12/1998 Park et al.
5,849,608 A 12/1998 Abe
6,097,609 A 8/2000 Kabadi
6,143,981 A * 11/2000 Glenn ....................... 174/52.4
6,191,490 B1 * 2/2001 Huang ........................ 257/782
6,265,768 B1 7/2001 Su et al.
6,297,543 B1 10/2001 Hong et al.

FOREIGN PATENT DOCUMENTS

DE 37 01 310 A1 7/1988

* cited by examiner

*Primary Examiner*—Jerome Jackson
(74) *Attorney, Agent, or Firm*—Laurence A. Greenberg; Werner H. Stemer; Ralph E. Locher

(57) ABSTRACT

The invention relates to an electronic device and a leadframe and to methods for producing the electronic device and the leadframe. The electronic device has a semiconductor chip with a top side fixed on a rewiring plate by a double-sided adhesive film. The underside of the rewiring plate has an edge region with through openings. The through openings are filled with a plastics compound that holds together the semiconductor chip and the rewiring plate by acting as a mechanical clip.

27 Claims, 9 Drawing Sheets

ELECTRONIC DEVICE AND LEADFRAME AND METHODS FOR PRODUCING THE ELECTRONIC DEVICE AND THE LEADFRAME

BACKGROUND OF THE INVENTION

Field of the Invention

The invention relates to an electronic device and a leadframe and to methods for producing the electronic device and the leadframe.

Electronic devices, which essentially include a semiconductor chip with a rewiring plate arranged thereon, often exhibit a failure phenomena in the form of microcracks located in the corners of the semiconductor chip and in the form of bulges of the rewiring plate relative to the top side of the semiconductor chip during the different temperature processes. Such bulges and/or microcracks in the corners of the semiconductor chip can lead to the complete failure of the electronic device.

SUMMARY OF THE INVENTION

It is accordingly an object of the invention to provide an electronic device, a leadframe, and methods for producing the electronic device and the leadframe, which overcome the above-mentioned disadvantages of the prior art apparatus of this general type.

In particular, it is an object of the invention to largely prevent bulging of the rewiring plate during the different temperature processes, to prevent microcracks in the corners of the semiconductor chips, and to reduce the failure rate of the electronic devices.

With the foregoing and other objects in view there is provided, in accordance with the invention, an electronic device including: a semiconductor chip having an active top side; a rewiring plate having a top side and an underside; and a double-sided adhesive film connecting the top side of the rewiring plate to the active top side of the semiconductor chip. The rewiring plate is formed with a plurality of through openings filled with a plastics compound. The plastics compound encapsulates the top side of the semiconductor chip at the underside of the rewiring plate, and the plastics compound forms a mechanical clip.

In other words, in order to achieve the above object, an electronic device having a semiconductor chip and a rewiring plate is provided in which the top side of the rewiring plate is connected to the active top side of the semiconductor chip by a double-sided adhesive film, and in which the rewiring plate has, on its underside, through openings filled with a plastics compound. The plastics compound simultaneously surrounds the entire semiconductor chip in an encapsulating manner on the top side of the rewiring plate.

In this case, the plastics compound in the through openings of the rewiring plate forms, with the encapsulation of the semiconductor chip, a mechanical clip made of plastic both for the semiconductor chip and for the rewiring plate. The mechanical clip made of a plastics compound has the advantage of impeding bulges of the rewiring plate on the semiconductor chip. Moreover, the clip-effect plastics compound has the advantage that mismatches between the expansion coefficients of the semiconductor chip and the rewiring plate cannot have the effect of forming microcracks in the corners of the semiconductor chip. Despite the asymmetrical construction of such devices in the form of BOC housings (board-on-chip housings), nonuniform mechanical loads on the BOC housing can no longer occur. The plastic clip means that a considerable mechanical stress of the different constituent parts of the BOC housing in the operating temperature range of –55° C. to 125° C. for electronic devices cannot have a destructive effect on the latter.

Despite the relatively asymmetrical construction of the housing including the rewiring plate and the semiconductor chip, the clip action of the plastics compound can compensate for the mismatch between the rewiring plate and the semiconductor chip under thermal loading.

In addition to this positive effect of the plastic clip, the introduction of the through openings means that the proportion of plastics compound in the housing can be increased and all-round edge protection by the plastics compound can be achieved. Encapsulating the chip in a plastics compound means that not only the edges of the semiconductor chip are protected, but that it is also possible to surround the underside completely and the top side of the chip partially, namely in a bonding channel, by plastics compound. Moreover, a protective layer of the semiconductor chip, for example, made of polyimide, is subjected to compressive, and no longer to tensile, loading as a result of the clip action of the plastics compound. Consequently, no microcracks can form in the semiconductor chip. In addition, the effect of the rewiring plate under temperature loading is essentially prevented and is weakened by the inventive arrangement.

Consequently, the electronic device has the following advantages:

- no or significantly lower mechanical loading of the semiconductor chip;
- no bulging of the rewiring plate during the process steps with a temperature influence;
- lower moisture absorption of the housing construction;
- complete edge protection of the semiconductor chip; and
- the sensitive protective layer edge on the active top side of the semiconductor chip is not in contact with the adhesive of the double-sided adhesive film, but rather only in contact with the plastics compound, which exerts no tensile loading on the protective layer edge on the active top side of the semiconductor chip.

In one embodiment of the invention, the plastics compound is a housing injection-molding compound for electronic semiconductor devices. Such housing injection-molding compounds have the advantage that they cool from the melting point after the pressure injection process and in doing so shrink to a greater extent than the constituent parts of the electronic device including semiconductor chip and rewiring plate. Consequently, a high compressive force acts on them in the cooled state, which force on the one hand holds the two together, so that bulging relative to one another cannot occur, and additionally exerts a pressure both on the rewiring plate and on the semiconductor chip, so that tensile loads on the two parts are essentially prevented.

In a further embodiment of the invention, the plastics compound has up to 15% by volume of short fibers. These short fibers have the advantage that they can be applied without changing the molding process using the housing injection-molding compound in the pressure injection process, yet at the same time significantly increase the strength with respect to tensile loading of the surrounding plastic encapsulating the chip. What is associated with this significant increase is that the clip action can act fully over the through openings in the rewiring plate and over the edge-encapsulating areas.

In another embodiment of the invention, the plastics compound has up to 15% by volume of filler. The filler may include ceramic particles and may have ceramic particles made of aluminum oxide, silicon nitride or silicon carbide or mixtures thereof. What is achieved by the filler is that the plastic on the one hand becomes stronger and on the other hand can absorb a considerable tensile loading without the clip fracturing at sensitive locations, such as the transition from the rewiring plate to the semiconductor chip.

In a further embodiment of the invention, the plastics compound has an epoxy resin. Such epoxy resins can be precisely coordinated through their specific composition to the requirements of the pressure transfer to the components of the electronic device, such as the semiconductor chip and the rewiring plate.

In a further embodiment of the invention, the through openings filled with plastics compound in the rewiring plate are arranged in the edge region of the rewiring plate, and the edge of the semiconductor chip partly overlaps the through openings on the top side of the rewiring plate. What is achieved by this embodiment of the invention is that the edge region of the topmost layer of the semiconductor chip, namely an insulation layer, is surrounded by plastics compound. The insulation layer may include a polyimide layer, a silicon nitride layer or a silicon dioxide layer. It is intended to ensure that the lines on the top side of the semiconductor chip are protected against short circuits and external influences. The insulation layer can be essentially composed of polyimide. What is achieved by the overlapping of the semiconductor chip with the through openings in the edge region of the rewiring plate is that a pressure effect of the plastic clip is built up on the edges of the insulating protective layer. This pressure effect provides for compensation of the tensile loading that proceeds from the adhesive of the double-sided adhesive plastic film. What is thus simultaneously achieved is that the risk of microcrack formation within the semiconductor chip and in particular in its corners is reduced.

The clip action can be optimized in a plurality of different embodiments of the invention. In one of these embodiments, opposite edge regions of the rewiring plate have through openings filled with plastics compound. The through openings are, in principle, long slots which extend along the opposite edge regions and thus form a clip, which avoid a displacement or bulging of the rewiring plate.

A further embodiment of the invention provides for the corner regions of the rewiring plate to have angular through openings filled with plastics compound. Such angles as through openings which are subsequently filled with plastics compound have the advantage that they, in particular, protect the very sensitive corners of the semiconductor chip against microcracks, by compensating for thermal stresses.

With the foregoing and other objects in view there is provided, in accordance with the invention, a leadframe for a plurality of electronic devices. The leadframe includes a top side with a plurality of device positions for positioning a double-sided adhesive film and for fitting a respective semiconductor chip in each one of the plurality of the device positions. Each one of the plurality of the device positions have edge regions formed with a plurality of through openings for introducing a mechanical clip made of a plastics compound.

In other words, the leadframe has a top side with a plurality of device positions for positioning a double-sided adhesive film and for fitting a respective semiconductor chip in each device position. In addition, the leadframe has, in each of the device positions, and in particular in the edge sides of the device positions, through openings for introducing a mechanical clip made of plastic.

Such through openings may be partly cylindrical, that is to say they are simple holes through the rewiring plate and thus through the leadframe. The leadframe is thus simultaneously the supplier for the rewiring plate in each device position. That is to say the material of the leadframe and the layer construction of the leadframe correspond to the material and to the layer construction of the rewiring plate, so that the device position of the leadframe simultaneously represents the rewiring plate for each individual electronic device.

A further embodiment of the invention provides for the through openings to be formed partly in strip form. These strips are arranged in the edge region and run parallel to the edge of the device positions and are through openings, so that they can be filled with plastic from the top side of the leadframe. The plastic then penetrates as far as the underside of the leadframe, on which the through openings can be seen.

In addition to strip-type and cylindrical through openings, partly angular through openings are also provided, which are arranged in particular in the corner regions of the rewiring plate. Such an arrangement in the corner regions embraces in particular also the sensitive corner regions of each individual electronic semiconductor chip as soon as the rewiring lines are connected to the corresponding chips and a molding compound has been introduced from the chip side through the through openings.

In addition to the through openings exercising a clip function in the edge region of each device position of the leadframe, the leadframe has a bonding channel as a further through opening in each device position. This bonding channel has nothing to do with the stress-relieving clip function, rather it is necessary in order to enlarge the microscopically small contact areas of the semiconductor chip via bonding connections and rewiring lines to macroscopic external contact areas. The external contact areas are distributed uniformly on the rewiring plate and the underside thereof, to be precise in rows and columns, and thus afford significantly greater possibilities of access to the electronic circuit of the semiconductor chip than the microscopically small contact areas directly on the semiconductor chip.

In this connection, microscopically small means a dimension in the micrometer range which can only be measured under an optical microscope, while macroscopic dimensions mean that the latter are discernible even with the naked eye and can be measured using simple auxiliary means.

In a further embodiment of the invention, the leadframe has, in each device position on its underside, rewiring lines with bonding ends and external contact areas. The bonding ends may be, on the one hand, lengthened rewiring lines which are led as line bridges over the bonding channel and can thus be bonded directly as flat conductors onto the contact areas of the semiconductor chip, or the bonding ends may also end directly at the edge of the bonding channel, so that it becomes necessary to use bonding wires in order to connect the bonding ends to the microscopically small contact areas of the semiconductor chip.

With the foregoing and other objects in view there is provided, in accordance with the invention, a method for producing a leadframe. The method includes steps of: providing a core plate made of a glass-fiber-reinforced plastic and providing the core plate with an underside including a structured metal layer having rewiring lines formed with ends having external contact areas for external contacts and bonding ends for bonding connections, the rewiring lines being formed in a plurality of device positions; applying an insulation layer on the underside of the core plate without covering the bonding ends and without covering the external contact areas; in each one of the plurality of the device positions, introducing a through opening serving as a bonding channel; and in edge regions of each one of the plurality of the device positions, introducing a plurality of through openings for receiving a mechanical clip made of a plastics compound.

In other words, the method for producing the leadframe has the following method steps:

providing a core plate made of glass-fiber-reinforced plastic with a structured metal layer, which has rewiring lines with bonding ends and with external contact areas in a plurality of device positions on the underside of the core plate;

applying an insulation layer to the underside of the core plate while leaving free the bonding ends and the external contact areas for bonding connections or for external contacts on the ends of the rewiring lines; and introducing through openings in each device position on the one hand as bonding channel and on the other hand in the edge regions of each device position for receiving a mechanical clip made of a plastics compound.

This method has the advantage that the leadframe already provides all of the conditions for being able to position an electronic device at a plurality of device positions. In this case, this method has the particular advantage that the through openings required for the electronic device can be implemented simultaneously in one step with the production of the bonding channel openings. Consequently, there is no need for additional method steps in order to produce a suitable leadframe.

Since the surfaces of the metal layer are not simultaneously suitable for bonding and for applying external contacts, in further method steps a bondable coating is applied to the left-free bonding ends. Moreover, after or before that, a solder coating may be applied to the left-free external contact areas. Both the bondable coating and the solder coating may be implemented before or after introducing the through openings in the edge region of each device position for the plastic clip and for the bonding channel.

A further exemplary implementation of the method provides for introducing the through openings in each device position of the leadframe using stamping technology. Such stamping technology has already proved worthwhile, so that, with this stamping technology, many device positions of a leadframe can be produced simultaneously and in parallel by using a single stamping operation.

In a further exemplary implementation of the method, the introduction of through openings in each device position of the leadframe is effected using laser removal. Such laser removal is appropriate particularly when the bonding is intended to be effected by bonding lengthened rewiring lines in the bonding channel—that is to say that the metal layer on the rewiring plate is structured directly in such a way as to form conductor track bridges above the bonding channel, which can then be uncovered by laser removal in a gentle fashion. This laser removal can also simultaneously be used, in addition to the bonding channel, for the through openings in the edge region of each device position of the leadframe.

With the foregoing and other objects in view there is provided, in accordance with the invention, a method for producing electronic devices. The method includes: performing the method according to claim 19 for producing the lead frame; applying a structured double-sided adhesive film to a top side of the lead frame, the double-sided adhesive film having openings in each one of the plurality of the device positions, the double-sided adhesive film being made smaller in each one of the plurality of the device positions than a protective layer configured on an active top side of a respective semiconductor chip; in each one of the plurality of the device positions, applying an active top side of the respective semiconductor chip to the double-sided adhesive film; in each one of the plurality of the device positions of the leadframe, producing bonding connections between the rewiring lines on the underside of the lead frame and contact areas on the active top side of the respective semiconductor chip; applying the plastics compound on the top side of the leadframe to: encapsulate each respective semiconductor chip, fill the bonding channel of each one of the plurality of the device positions, and fill the plurality of the through openings in the edge regions of each one of the plurality of the device positions; and separating the leadframe into individual electronic devices.

In other words, the production of the electronic device has the following method steps:

applying a structured double-sided adhesive film with openings in each device position to the top side of the lead frame, the double-sided adhesive film being made smaller than a protective layer arranged on the top side of the semiconductor chip;

applying the active top side of a semiconductor chip to the double-sided adhesive film;

producing bonding connections between the rewiring lines on the underside of the lead frame and contact areas on the active top side of the semiconductor chip in the region of the bonding channel in each device position of the leadframe;

applying a plastics compound for encapsulating the semiconductor chip on the top side of the leadframe and for filling the bonding channel and also for filling the through openings in the edge regions of each device position of the leadframe; and separating the leadframe, which has a plurality of semiconductor chips and is covered by a closed plastics compound, into individual electronic devices.

This method has the advantage that the clip made of plastic in the through openings of each device position can also be produced simultaneously, with a limited number of method steps, in addition to the filling of the bonding channel. Moreover, the method has the advantage that the entire leadframe, for all of the device positions, is covered with a closed plastics compound, so that extremely minor requirements have to be made of the injection mold. Only in a final or penultimate method step is the leadframe, with plastics compound and embedded semiconductor chips and bonding connections, then separated into individual electronic devices. These electronic devices may already have external contacts if such external contacts were applied in the form of solder balls before the separation of the leadframe in the individual positions of the external contact areas of the rewiring lines.

If the leadframe already has line bridges over each of the bonding channels, which are oriented with respect to the contact areas of the semiconductor chip, then it is possible, during the production of the bonding connections, to employ a method in which merely the line bridges are separated at desired breaking points and then pressed onto the contact areas of the semiconductor chip using a simple bonding step.

If the leadframe does not have such line bridges over the bonding channels, then a bonding wire is bonded from the bonding ends, which may be coated with a bondable coating, and led to the contact area on the semiconductor chip. In both bonding methods, in a further exemplary implementation of the method, it is possible to use thermosonic bonding, ultrasonic bonding or thermo compression bonding.

To summarize, it must be emphasized that this invention provides a leadframe which permits the semiconductor chip to be completely surrounded with plastics compound both at the edge and at the top side and underside, and at the same time, permits the plastics compound to engage in the rewiring plate in each device position of the leadframe and to form a clip which holds together the rewiring plate and the semiconductor chip. In this case, the double-sided adhesive film is simultaneously prevented from inducing a tensile load in the semiconductor chip via a protective layer, since the edges of the topmost layer of the semiconductor chip, namely the edges of the protective layer, are now taken up by the plastics compound of the clip.

Consequently, in a similar manner to the LOC package (leadframe on chip), the plastics compound can be selected such that it exerts only a compressive, but no tensile, loading on the protective layer edge during a stress test. In addition, the design of the plastics compound can be chosen such that bulging of the substrate under a temperature load, such as a thermal step, no longer takes place or takes place in an extremely weakened manner. Consequently, the problem of microcracks in the corners of the semiconductor chip on account of tensile loading, which have existed hitherto on because of the mismatch between the semiconductor chip and the double-sided adhesive film, is also largely solved and the in some instances the large bulge of the substrate during the different temperature processes is prevented.

Other features which are considered as characteristic for the invention are set forth in the appended claims.

Although the invention is illustrated and described herein as embodied in an electronic device and leadframe and methods for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
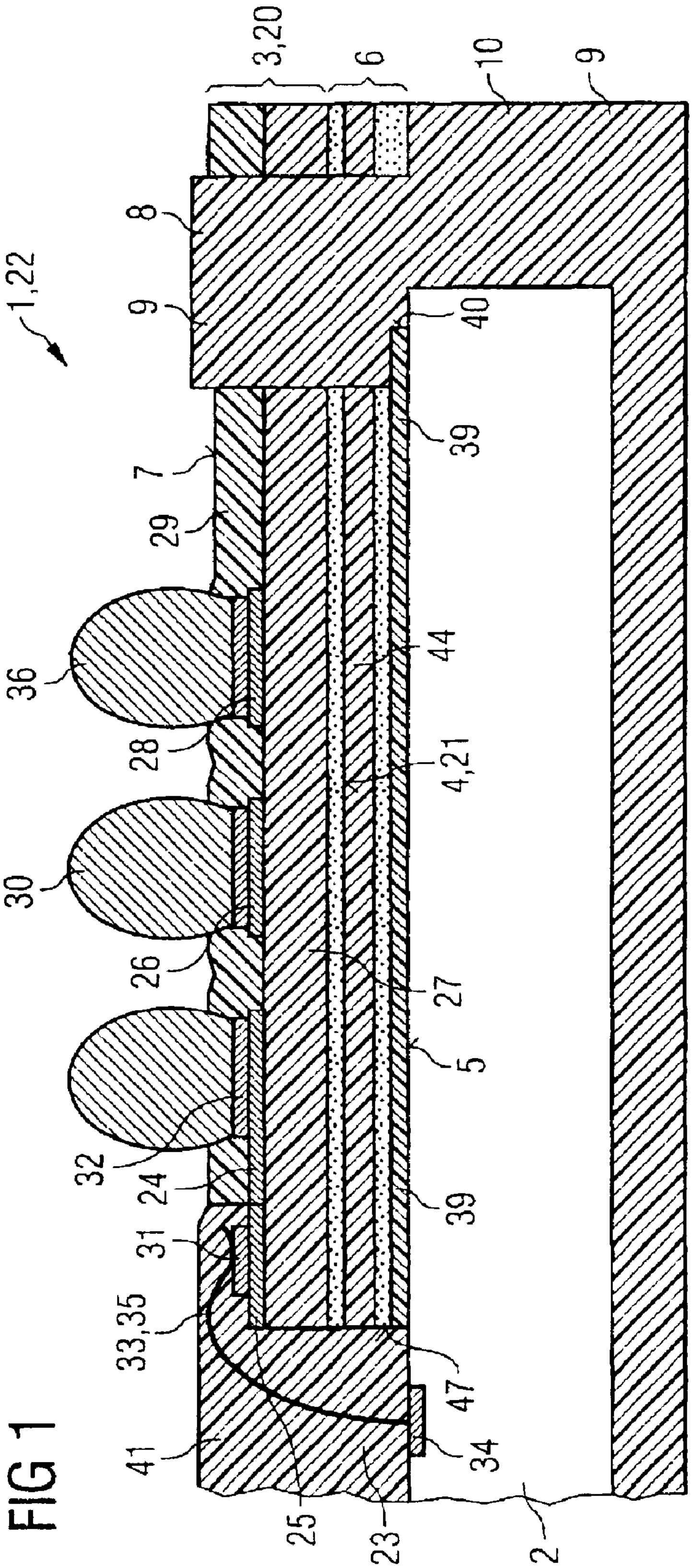
FIG. 1 is a diagrammatic cross sectional view through a partial region of an electronic device.

Referring now to the figures of the drawing in detail and first, particularly, to FIG. 1 thereof, there is shown a diagrammatic cross sectional view through a partial region of a first embodiment of an electronic device 1. The reference symbol 2 identifies a semiconductor chip on which a rewiring plate 3 is arranged. The rewiring plate 3 is fixed by a double-sided adhesive film 6 on the active top side of the semiconductor chip 2 whilst leaving free a bonding channel 23. The active top side 5 of the semiconductor chip 2 has contact areas 34 in the region of the bonding channel.

The reference symbol 4 identifies the top side of the rewiring plate 3. The underside of the rewiring plate 3 is identified by the reference symbol 7. A plurality of layers are arranged between the underside 7 of the rewiring plate 3 and the top side 4 of the rewiring plate 3. The reference symbol 27 identifies a core plate of the rewiring plate 3. The core plate 27 has a fiber-reinforced plastic. The underside of the core plate 27 is coated with a metal layer 28. The metal layer 28 is structured into rewiring lines 24. The rewiring lines 24 connect bonding ends 25 in the edge region of the bonding channel 23 to external contact areas 26, which are distributed over the underside 7 of the rewiring plate 3 in rows and columns.

The reference symbol 32 identifies a solder coating on the external contact areas 26, and the reference symbol 31 identifies a bondable coating on the bonding ends 25 of the rewiring lines 24. Directly on the structured metal layer 28, with bonding ends 25 and external contact areas 26 being left free, an insulation layer 29 is arranged as the bottommost layer on the underside 7 of the rewiring plate 3. This layer construction of the rewiring plate 3 including an insulation layer 29, an underlying structured metal layer 28 and a core plate 27, which carries this layer sequence, has a mismatch in the thermal expansion coefficients between the core plate 27 of the rewiring plate 3 and the semiconductor material of the semiconductor chip 2.

In order to be able to counteract this mismatch, the rewiring plate 3 has through openings 8 in its edge regions. The through openings 8 are filled with a plastics compound 9, which simultaneously encapsulates the semiconductor chip 2 on the top side 4 of the rewiring plate 3. In this case, the plastics compound 9 forms a mechanical clip 10 between semiconductor chip 2 and the edge region of the rewiring plate 3, so that the abovementioned thermal mismatch is compensated for by the clip 10. In order to mechanically reinforce the plastics compound 9 serving as clip 10, the plastics compound may have up to 15% by volume of short fibers. The mixture including the short fibers and the plastics compound can be potted in one work step without any disturbances and considerably increases the strength of the clip.

The double-sided adhesive film is applied on the top side 4 of the rewiring plate 3 whilst leaving free the bonding channel 23 and whilst leaving free the through openings 8. The double-sided adhesive film 6 is constructed in three layers in this embodiment of the invention. The core material 44 of the double-sided adhesive film 6 essentially includes a polytetrafluoroethylene fabric. The top side and the underside of the polytetrafluoroethylene fabric are coated with an epoxide-based adhesive, the underside being adhesively connected to the rewiring plate 3 and the top side, with its adhesive, fixing the active top side of the semiconductor chip 2. In this case, the double-sided adhesive film 6 is dimensioned in such a way that it does not completely cover a topmost protective layer 39 of the semiconductor chip 2. Rather, the areas in the region of the edges 40 of the protective layer remain free of adhesive. At the same time, the through openings 8 in the edge region of the rewiring plate 3 are dimensioned in such a way that the edge region of the semiconductor chip 2 overlaps the through openings 8. Consequently, the edges 40 of the protective layer 39 can be completely surrounded with plastics compound 9. As a result, the mechanical clip 10 made of the plastics compound also acts on the edges 40 of the protective layer 39 and thus prevents a tensile loading by the adhesive on the top side of the protective layer 39, and as a result, simultaneously prevents a tensile loading of the underlying monocrystalline semiconductor chip 2.

Consequently, the top side of the adhesive is pressed only onto the active top side 5 of the semiconductor chip 2, but not onto the edge region. In this case, only the surface of the protective layer 39 made of silicon nitride, silicon carbide, or a polyimide is impressed onto the active top side 5 of the semiconductor chip 2 into the adhesive of the double-sided adhesive film 6. The adhesive layer on the underside of the double-sided adhesive film 6 is fixed directly onto the core plate 27 of the rewiring plate 3. Consequently, the construction of the rewiring plate 3 in conjunction with the plastics compound 9 makes it possible to reduce the height of the overall device.

If the rewiring plate 3 were symmetrically constructed, an insulation layer would have to be provided both on the top side of the core plate 27 and on the underside of the core plate 27. In the case of the inventive embodiment, however, only the underside 7 of the rewiring plate 3 is provided with an insulation layer 29. Consequently, a very compact construction is achieved with this embodiment of the invention. Furthermore, the underside of the device has a closed plastic layer, so that here, too, a gain in space can be noted relative to completely packaged electronic devices.

A further advantage of the embodiment shown in FIG. 1 is that the heights of the plastics compound 9 in the through openings 8 can be matched to the height of the plastics compound 41 in the bonding channel 23. As a result, when fitting the electronic device 1 on a superordinate printed circuit board system, the melting-on of the external contacts 30 in the form of soldering balls 36 on the external contact areas 26 can be limited to the height of the plastics compound 9 in the through openings 8 or to the height of the plastics compound 41 in the bonding channel 23.

Figure 2:
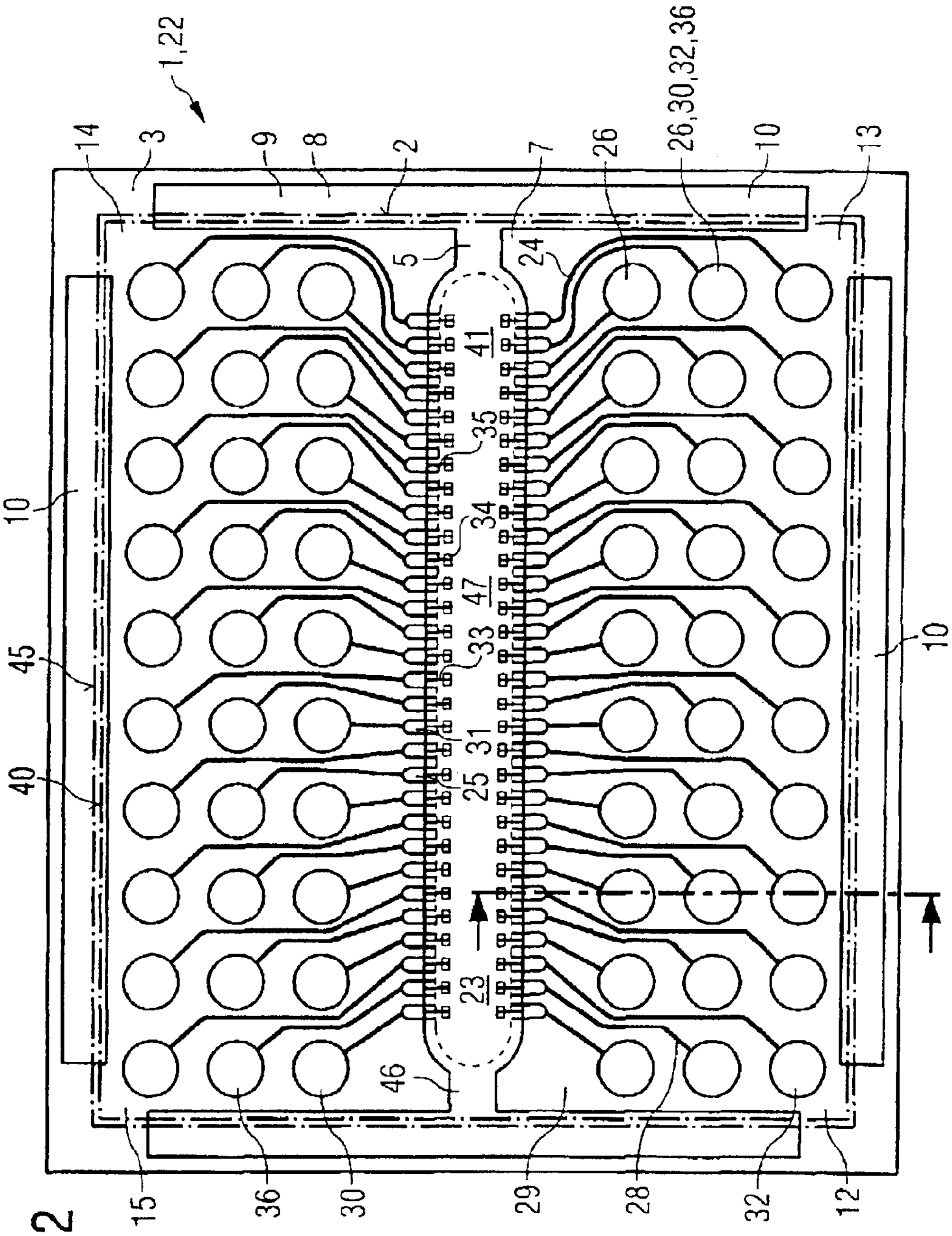
FIG. 2 is a diagrammatic bottom view of the electronic device shown in FIG. 1.

FIG. 2 is a diagrammatic bottom view of the electronic device shown in FIG. 1. Components with functions identical to those in FIG. 1 are identified by the same reference symbols and are not discussed separately.

The underside of the electronic device 1 that is shown here has sixty external contacts 30. The sixty external contacts 30 are arranged in six rows and ten columns and leaves a bonding channel 23 in the center of the electronic device 1. The bonding channel 23 is identified using a broken line. In this bonding channel 23, in which the active top side 5 of the semiconductor chip 2 is sketched, contact areas 34 are arranged on the active top side 5 of the semiconductor chip 2. The contact areas 34 are connected to the bonding ends 25 of the rewiring lines 24 via bonding connections 33. The rewiring lines 24 lead from the microscopically small bonding ends 25 to macroscopic external contact areas 26, on which solder balls 36 are fixed as external contacts 30 using a solder coating 32.

The rewiring lines 24 shown in FIG. 2 are visible only when the insulation layer 29, lying as a soldering resist layer on the rewiring lines 24, is transparent. The same applies to the bonding channel 23, delimited by a broken line, and the contact areas 34 arranged therein, which are covered by a nontransparent plastics compound 41 and are usually not visible. Therefore, they are only sketched in FIG. 2 in order that the connection between the contact areas 34 of the semiconductor chip 2 and the external contact areas 36 for the external contacts 30 are made visible.

The characterizing feature of this underside of the electronic device 1 is the through openings 8 in the edge region of the rewiring plate 3, which are filled with the plastics compound 9, and which also encapsulate the semiconductor chip 2. The outer edge of the plastics compound 9 is marked by a dash-dotted line 45. The through openings 8 in the rewiring plate 3 are arranged in the edge region of the rewiring plate 3 in such a way that they are partly overlapped by the semiconductor chip 2. What is thus achieved, as mentioned above, is that the edges 40 of the protective layer 39 arranged on the top side 5 of the semiconductor chip 2 project into the region of action of the plastic clip 10, formed from the plastics compound 9. It is thus possible to compensate for the tensile stress—induced by the adhesive layer of the double-sided adhesive film 6—on the protective layer 39 and thus on the semiconductor chip 2 by using the plastic clip 10, so that the tensile loading of the semiconductor chip 2 under thermal stress is reduced.

Furthermore, the bottom view of the electronic device in FIG. 2 shows a connecting opening 46 in the rewiring plate 3 from the through openings 8 in the edge region of the rewiring plate 3 to a through opening 47 for the bonding channel 23. The connecting opening 46 enables the plastics compound 9 also to fill the bonding channel 23 by using a single injection-molding step.

Figure 3:
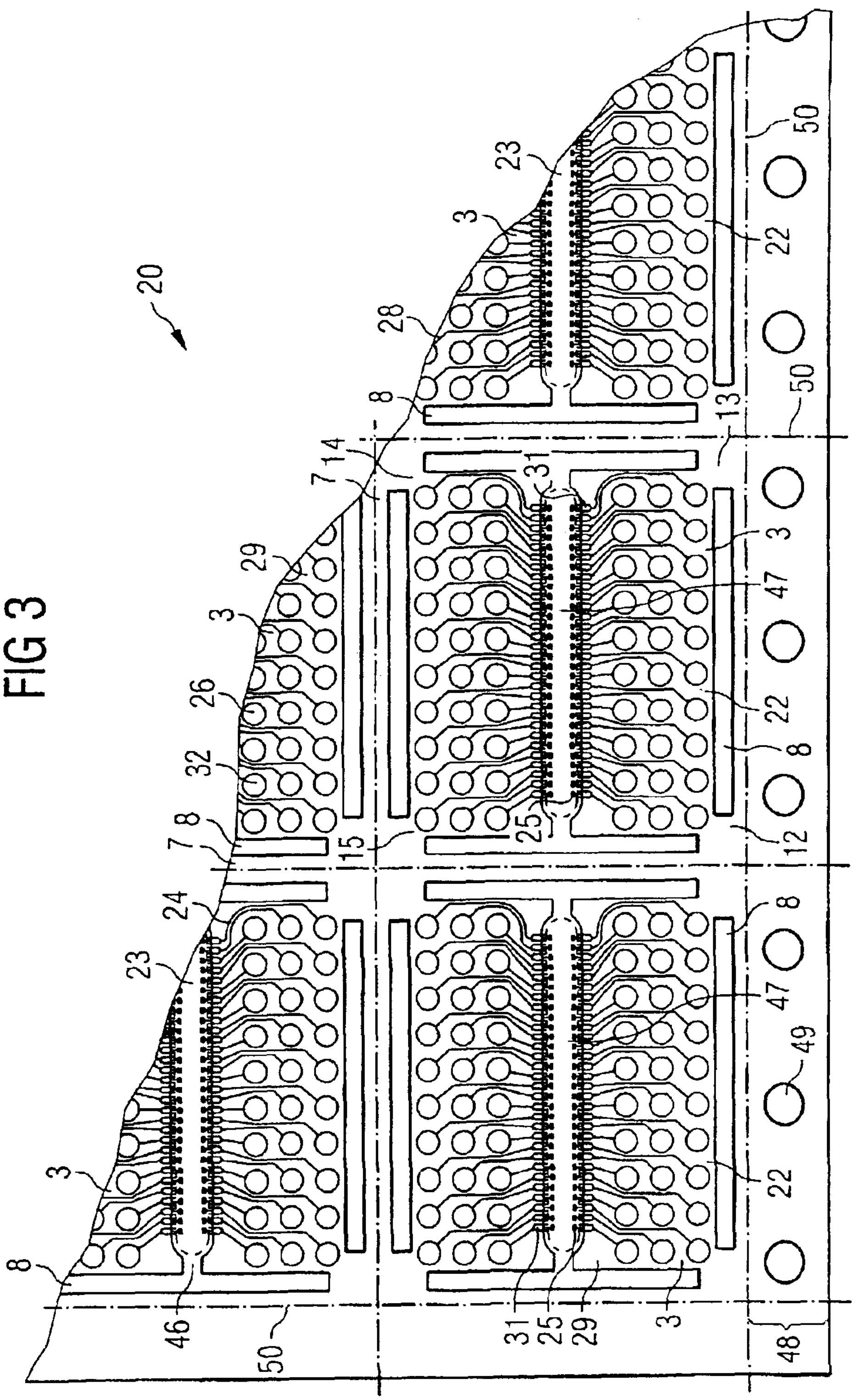
FIG. 3 is a diagrammatic bottom view of a partial region of a leadframe for constructing the electronic device shown in FIG. 1.

FIG. 3 is a diagrammatic bottom view of a partial region of a leadframe 20 for constructing the electronic device 1 shown in FIG. 1. Components with functions identical to those in the preceding figures are identified by the same reference symbols and not discussed separately.

The underside of this segment of a leadframe 20 exhibits a plurality of device positions 22. Each device position 22 has a through opening at its center, which serves as a bonding channel opening 47 in each device position 22. Furthermore, the leadframe 20 has an edge strip 48 provided with perforation openings 49 arranged equidistantly. The edge strip 48 with its perforation is provided to enable the further transportation of the leadframe 20 in the various processing installations and simultaneously serves for adjusting and orienting the leadframe 20 in the installations.

Additional through openings 8 are provided in the edge regions of each device position 22, which through openings can be filled with a plastics compound 9 and are dimensioned in such a way that a semiconductor chip 2 can partly overlap the through openings 8. Moreover, a rewiring plane including rewiring lines 24, bonding ends 25 and external contact areas 26 is provided in each device position 22. The rewiring lines 24 are covered by an insulation layer 29. The insulation layer 29 leaves free only the external contact areas 26 and the bonding ends 25 and acts as a soldering resist layer when fitting external contacts.

The bonding ends 25 of the rewiring lines 24 may be covered with a bondable coating 31. Equally, a solder coating 32 may be arranged on the external contact areas 26. The provision both of the solder coating 32 and of the bondable coating on the bonding ends 25 may be carried out in parallel for all of the external contact areas 26 and the bonding ends 25 on the leadframe 20. The rewiring lines 24 covered by an insulation layer 29 are not usually visible, unless the insulation layer 29 is translucent or transparent.

The dash-dotted lines 50 indicate the separating tracks which occur when the lead frame 20 is divided into individual rewiring plates 3. Severing is usually effected along the separating lines 50 but only after the electronic device has been completely constructed in each device position 22, since this enables the method steps for producing an electronic device to be carried out in parallel on the leadframe 20.

A method for producing a leadframe of the kind shown in FIG. 3 has a plurality of method steps. First, a core plate 27 made of glass-fiber-reinforced plastic with a structured metal layer 28 on its underside is made available. The rewiring lines 24 with bonding ends 25 and external contact areas 26 are formed on the core plate 27 in a plurality of device positions 22. An insulation layer 29 is applied to the core plate 27 while leaving free the bonding ends 25 and the external contact areas 26. The insulation layer 29 can simultaneously be used as soldering resist layer in order to protect the rewiring lines 24 against a solder of external contacts.

The through openings 8 for the plastic clip 10 in the edge regions of each device position 22 and the bonding channel openings 47 can be effected using stamping.

A selective application of the insulation layer 29 can be effected using printing technology. If the insulation layer 29 is first applied as a closed layer, then the bonding ends 25 and the external contact areas 26 can be uncovered by selective laser removal of the insulation layer 29 or by a photolithographic technique.

Figure 4:
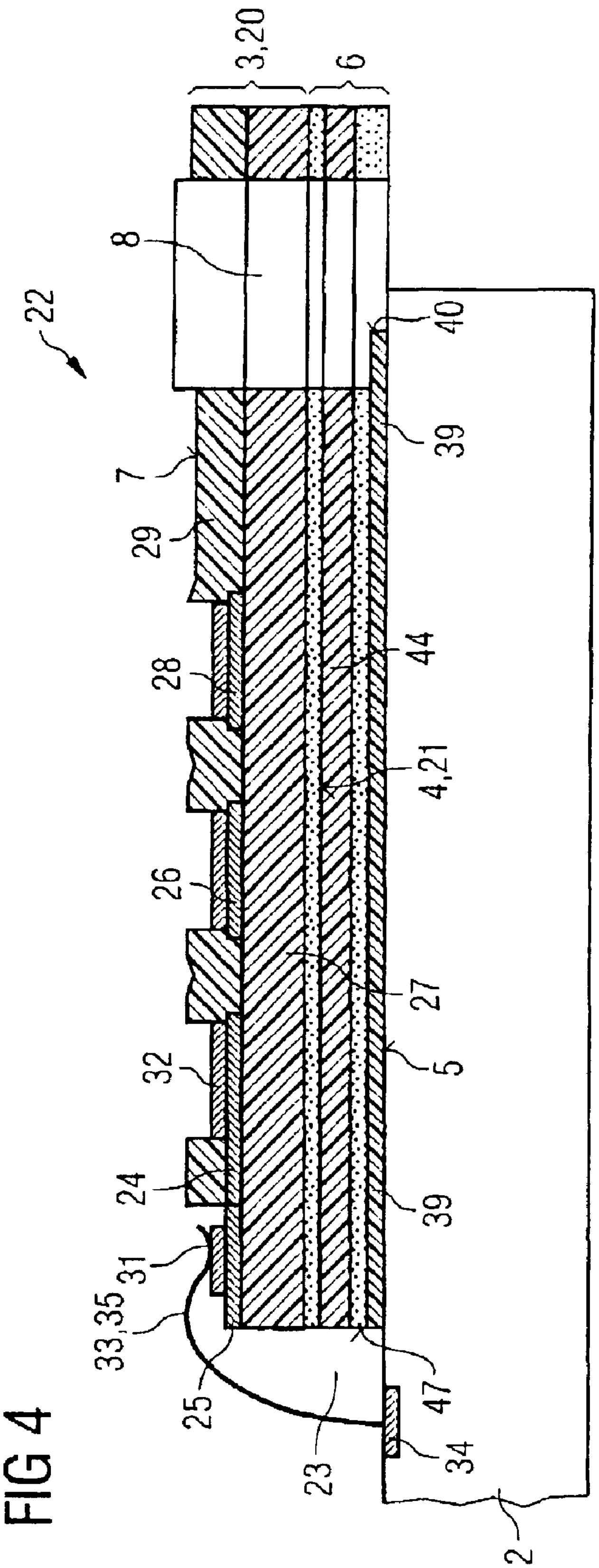
FIG. 4 is a diagrammatic cross sectional view of a partial region of a leadframe after a semiconductor chip has been placed and after bonding connections have been produced.

FIG. 4 is a diagrammatic cross sectional view of a partial region of a leadframe 20 after the placement of a semiconductor chip 2 and the production of the bonding connections 33. Components with functions identical to those in the preceding figures are identified by the same reference symbols and are not discussed separately.

FIG. 4 shows, in cross section, an intermediate step from the leadframe to the electronic device and illustrates the arrangement between through opening 8 for a plastic clip and the edge of the semiconductor chip 2. The semiconductor chip 2 projects with its edge and with its protective layer 39, in particular with the edge 40 of the protective layer 39, into the region of the through opening 8. This arrangement has the advantage that, in the event of single-sided potting of the leadframe 20 with adhesive film 6 and semiconductor chip 2, the resulting plastic clip likewise encloses the edges 40 of the protective layer 39, thereby compensating for the tensile effect of the adhesive film 6 on the top side 5 of the semiconductor chip 2.

Figure 5:
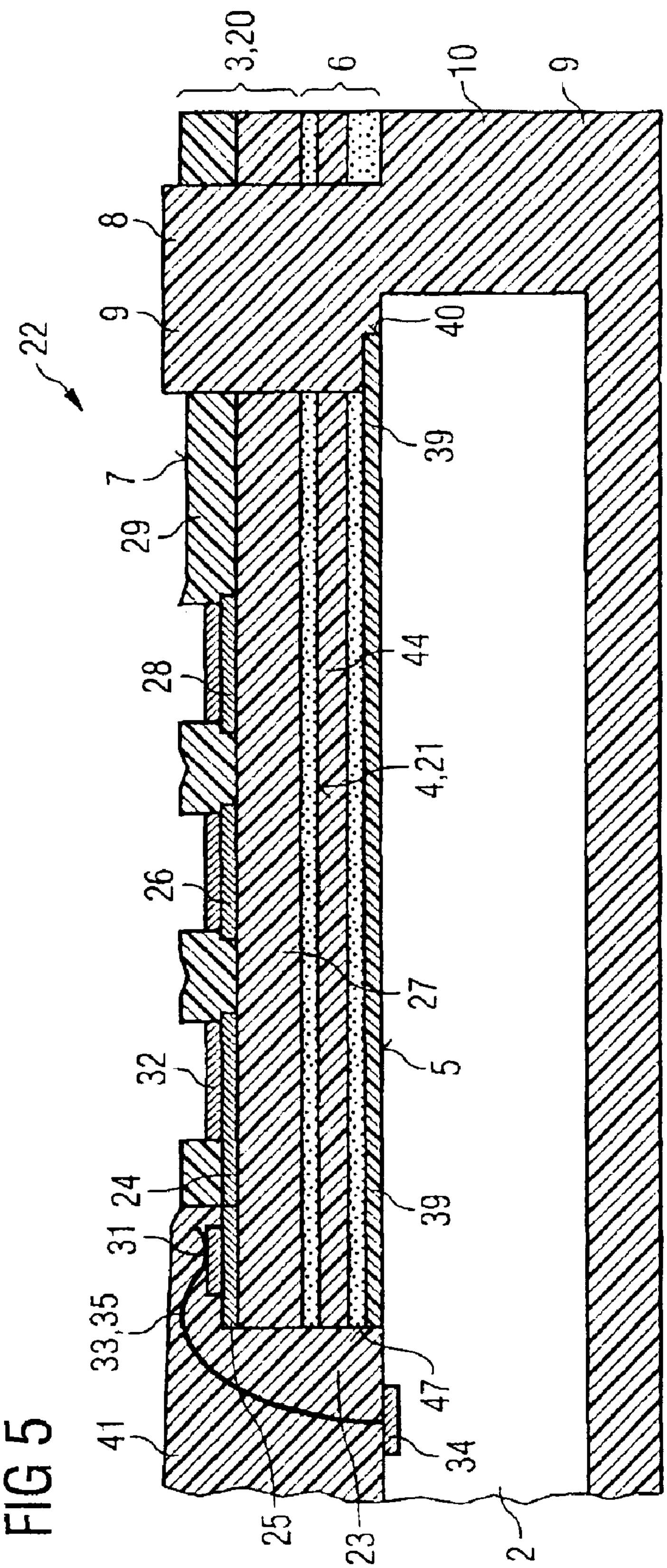
FIG. 5 is a diagrammatic cross sectional view of a partial region of a leadframe after a plastics compound has been applied.

FIG. 5 shows a diagrammatic cross section of a partial region of a leadframe 20 after the application of a plastics compound 9. Components with functions identical to those in the preceding figures are identified by the same reference symbols and not discussed separately.

The introduction of the plastics compound, as is shown in FIG. 5, gives rise to both the mechanical clip 10 made of plastic, which surrounds the semiconductor chip, and the covering with plastics compound 9 in the bonding channel 23. The penetration of the plastics compound 9 both into the through openings in order to form the plastic clip 10 and into the region of the bonding channel 23 is achieved by means of the connecting opening 46 shown in FIG. 2. The plastics compound 9 may be provided with short fibers for reinforcement, in order to increase the strength of the plastic clip 10. Such short fibers may take up up to 15% by volume of the plastics compound. Another possibility for increasing the strength and wear resistance properties of the electronic device 1 consists in filling the plastic with ceramic particles.

Figure 6:
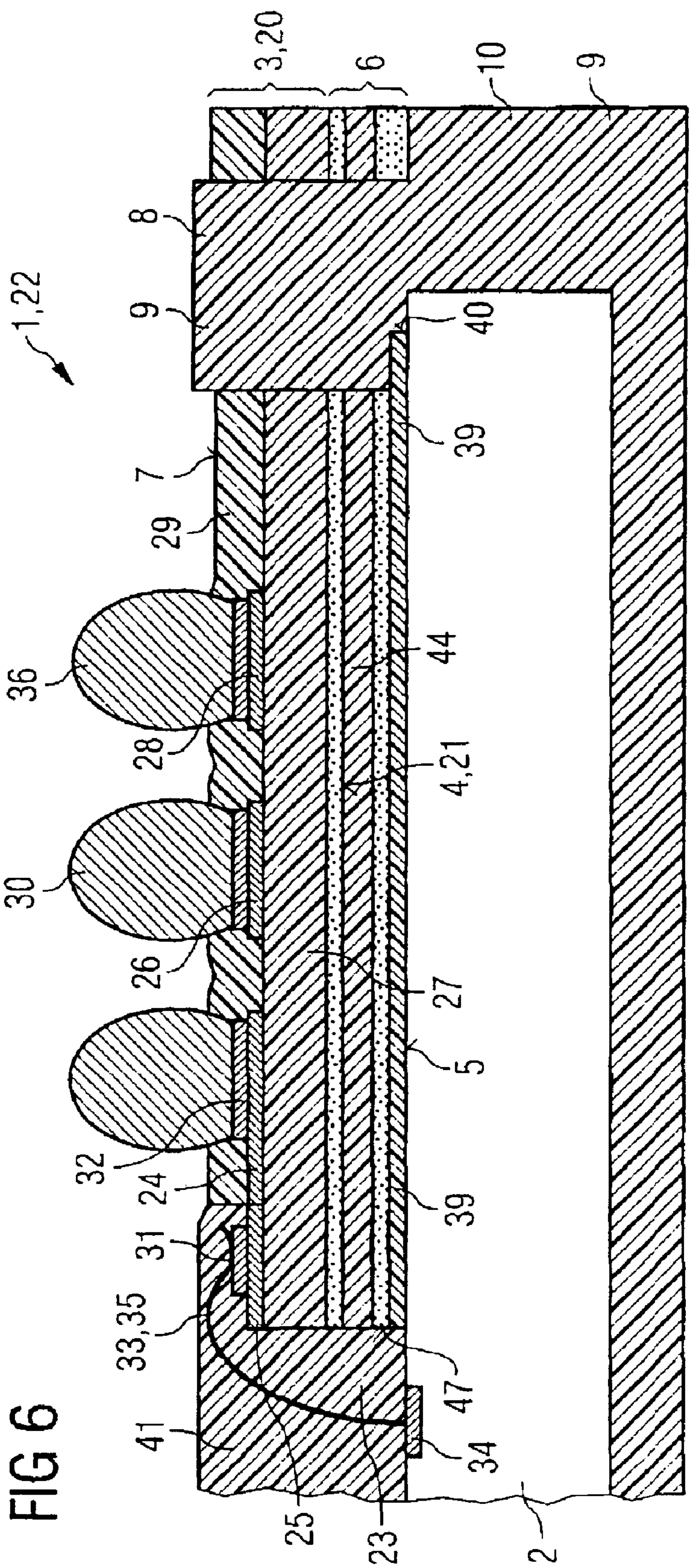
FIG. 6 is a diagrammatic cross sectional view of a partial region of a leadframe after external contacts have been applied.

FIG. 6 shows a diagrammatic cross section of a partial region of a leadframe 20 after the application of external contacts 30. Components with functions identical to those in the preceding figures are identified by the same reference symbols and not discussed separately.

The external contacts 30 can be applied simultaneously for all the devices of a leadframe 20 by applying solder balls 36 on the external contact areas 26 provided with a solder coating 32. By heating the leadframe 20, all the solder balls 36 can then be soldered on to form external contacts 30 in one step.

Since the plastics compound 9 is applied on one side on the entire leadframe whilst encapsulating the semiconductor chips 2, the leadframe 20 with semiconductor chips and applied solder external contacts 30 can be singulated to form individual functional electronic devices 1 by means of a single separating step.

Figure 7:
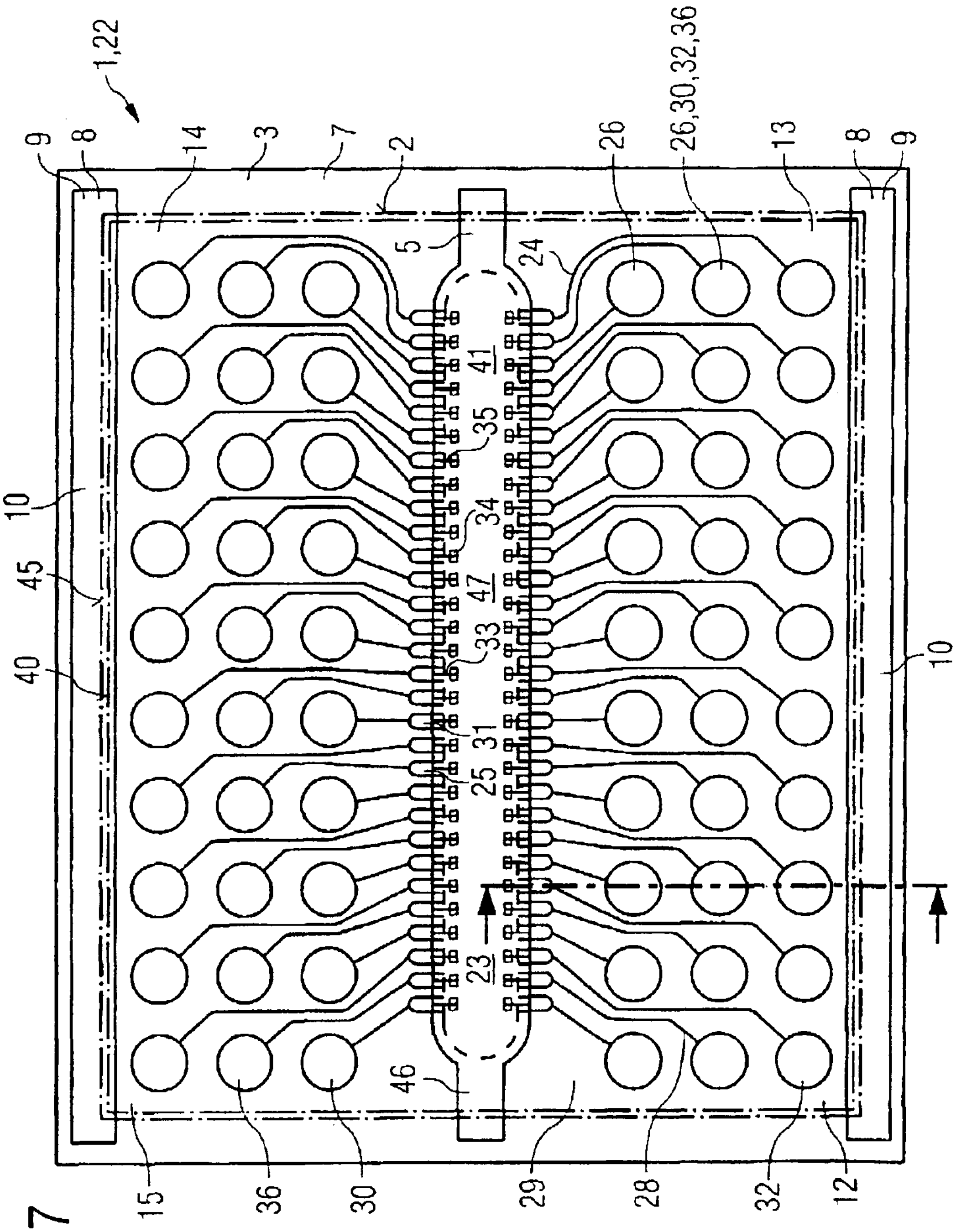
FIG. 7 is a diagrammatic bottom view of a second embodiment of an electronic device.

FIG. 7 shows a diagrammatic bottom view of an electronic device 1 of a second embodiment of the invention. Components with functions identical to those in the preceding figures are identified by the same reference symbols and not discussed separately.

The difference between this second embodiment according to FIG. 7 and the first embodiment according to FIG. 1 is that only a simple clip 10 made of plastics compound 9 is formed in this embodiment, since only on the longitudinal sides of the electronic device 1 are two elongate through openings 8 provided on opposite edge regions. However, in order also to fill the bonding channel 23 with plastics compound 9 at the same time as the formation of the mechanical clip 10, connecting openings 46 from the semiconductor chip side of the rewiring plate to the bonding channel side of the rewiring plate 3 are provided in this second embodiment of the invention, too.

Figure 8:
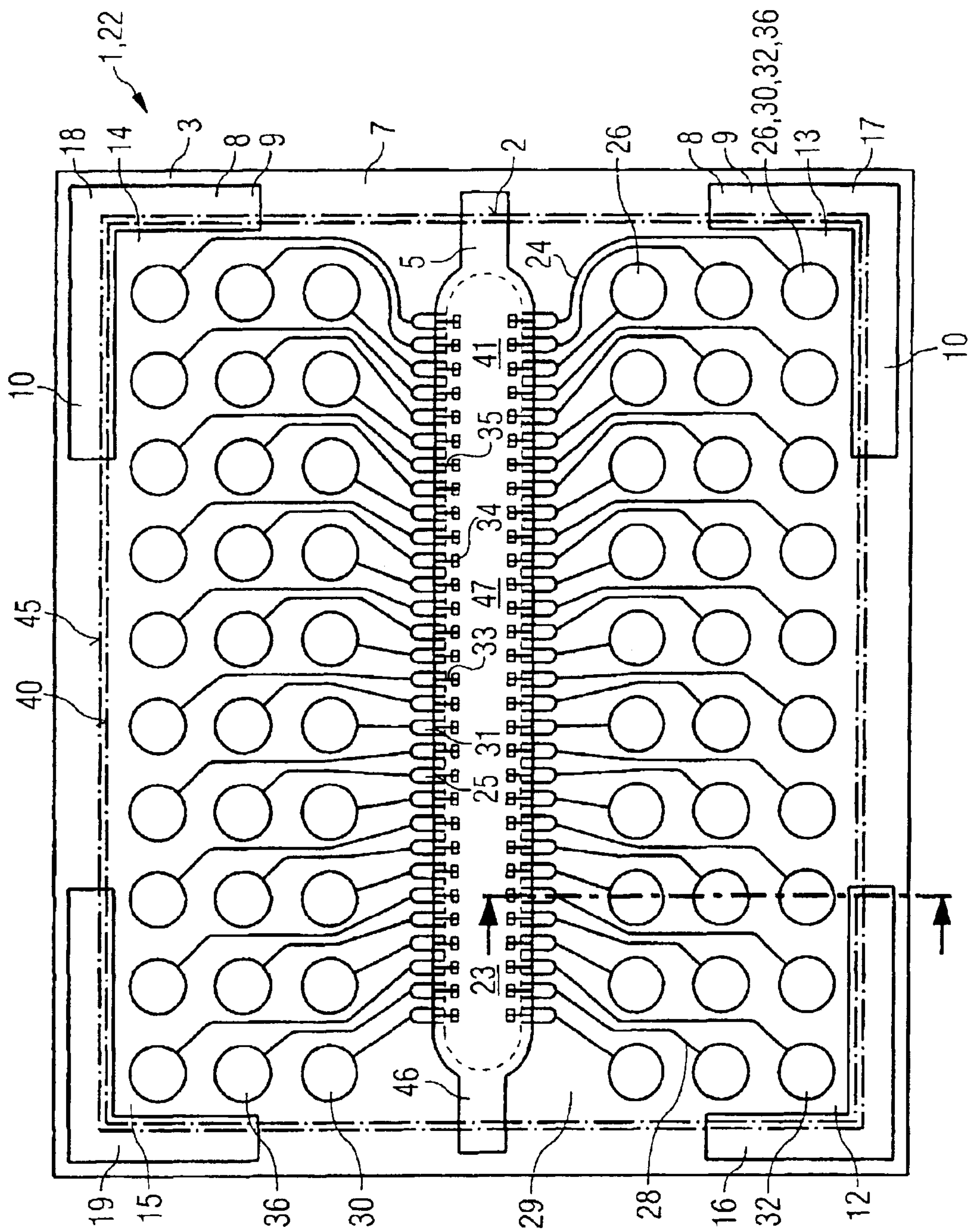
FIG. 8 is a diagrammatic bottom view of a third embodiment of an electronic device.

FIG. 8 shows a diagrammatic bottom view of an electronic device 1 of a third embodiment of the invention. Components with functions identical to those in the preceding figures are identified by the same reference symbols and not discussed separately.

The difference from the first two embodiments is that diagonal clips 10 are formed in this embodiment by angular through openings 16, 17, 18 and 19 being provided in all four corner regions 12, 13, 14 and 15. Such a clip acting via the diagonals has the advantage that the highly loaded corners of the semiconductor chip 2 are protected against microcracks, since tensile stresses on the corner regions of the semiconductor chip 2 are avoided by virtue of this diagonal clipping. In this third embodiment of the invention, too, connecting openings 46 are again provided in order to fill the bonding channel 23 with plastics compound 9 with the production of the mechanical clip 10.

Figure 9:
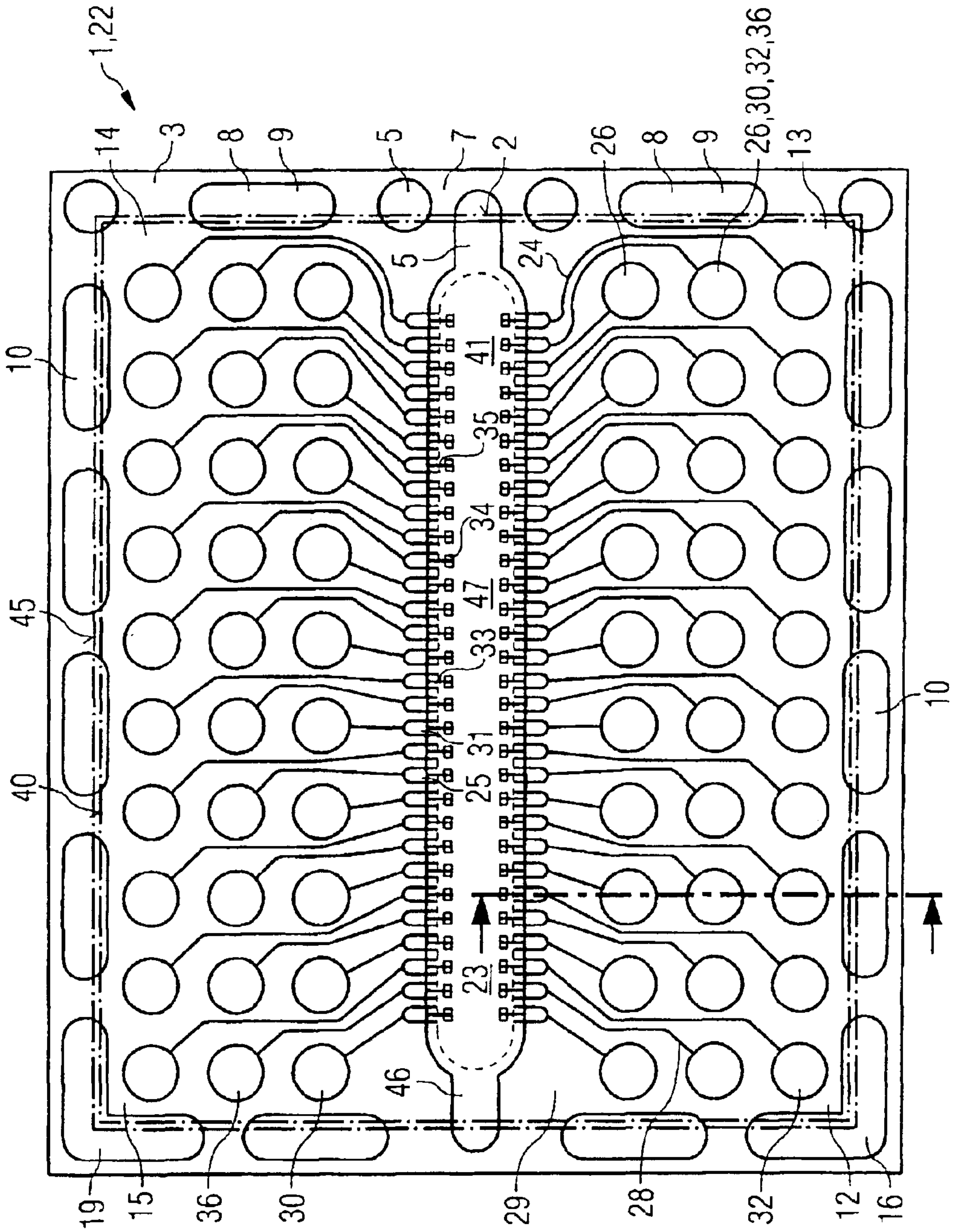
FIG. 9 is a diagrammatic bottom view of a fourth embodiment of an electronic device.

FIG. 9 shows a diagrammatic bottom view of an electronic device 1 of a fourth embodiment of the invention. Components with functions identical to those in the preceding figures are identified by the same reference symbols and not discussed separately.

One difference in the fourth embodiment of the invention according to FIG. 9 is that a multiplicity of through openings 8 for forming mechanical clips are introduced in the edge regions of the rewiring plate 3. Sharp edges are avoided in this case in order to avoid to the greatest possible extent notch effects on the plastics compound 9 of the plastic clips 10 to be formed.

We claim:

1. An electronic device, comprising:

a semiconductor chip having an active top side;

a rewiring plate having a top side and an underside; and a double-sided adhesive film connecting said top side of said rewiring plate to said active top side of said semiconductor chip;

said rewiring plate formed with a plurality of through openings filled with a plastics compound;

said plastics compound encapsulating said top side of said semiconductor chip at said underside of said rewiring plate; and said plastics compound forming a mechanical clip for said semiconductor chip and said rewiring plate.

2. The electronic device according to claim 1, wherein said plastics compound is a housing injection-molding compound for electronic semiconductor devices.

3. The electronic device according to claim 1, wherein said plastics compound has up to 15% by volume of short fibers.

4. The electronic device according to claim 1, wherein said plastics compound has up to 15% by volume of filler.

5. The electronic device according to claim 4, wherein said filler in said plastics compound has ceramic particles.

6. The electronic device according to claim 4, wherein said filler in said plastics compound has ceramic particles selected from a group consisting of aluminum oxide, silicon nitride, silicon carbide, and a mixture of particles; and said mixture of said particles includes at least two components selected from a group consisting of aluminum oxide, silicon nitride, and silicon carbide.

7. The electronic device according to claim 1, wherein said plastics compound has an epoxy resin.

8. The electronic device according to claim 1, wherein said plastics compound has a mixture of silicone plastic and epoxy resin.

9. The electronic device according to claim 1, wherein:

said rewiring plate has an edge region;

said plurality of said through openings are configured in said edge region of said rewiring plate; and said semiconductor chip has an edge, which at said top side of said rewiring plate, partly overlaps said plurality of said through openings.

10. The electronic device according to claim 9, wherein said plurality of said through openings are configured in strip form in said edge region of said rewiring plate.

11. The electronic device according to claim 1, wherein:

said rewiring plate has two mutually opposite edge regions; and said plurality of said through openings are formed in said edge regions.

12. The electronic device according to claim 1, wherein:

said rewiring plate has corner regions formed with said plurality of said through openings; and said plurality of said through openings are angular through openings.

13. In combination with a plurality of electronic devices each having a semiconductor chip, a leadframe comprising:

a plurality of rewiring plates with a top side;

a double-sided adhesive film positioned on said top side and fitting a respective semiconductor chip in each one of said plurality of said rewiring plates; and each one of said plurality of said rewiring plates having edge regions formed with a plurality of through openings for introducing a mechanical clip made of a plastics compound, said through openings at least partially extending into portions of edge regions of the respective semiconductor chip.

14. The leadframe according to claim 13, wherein said plurality of said through openings are partly cylindrical.

15. The leadframe according to claim 13, wherein said plurality of said through openings are partly in strip form.

16. The leadframe according to claim 13, wherein said plurality of said through openings are partly angular.

17. The leadframe according to claim 13, wherein each one of said plurality of said rewiring plates includes a bonding channel formed as a further through opening.

18. The leadframe according to claim 13, comprising an underside where each one of said plurality of said rewiring plates includes a plurality of rewiring lines with bonding ends, and a plurality of external contact areas.

19. A method for producing a leadframe, which comprises:

providing a core plate made of a glass-fiber-reinforced plastic and providing the core plate with an underside including a structured metal layer having rewiring lines formed with ends having external contact areas for external contacts and bonding ends for bonding connections, the rewiring lines being formed in a plurality of rewiring plates;

applying an insulation layer on the underside of the core plate without covering the bonding ends and without covering the external contact areas;

in each one of the plurality of the rewiring plates, introducing a through opening serving as a bonding channel; and in edge regions of each one of the plurality of the rewiring plates, introducing a plurality of through openings for receiving a mechanical clip made of a plastics compound.

20. The method according to claim 19, which comprises after uncovering the bonding ends, applying a bondable coating to the bonding ends.

21. The method according to claim 19, which comprises after uncovering the external contact areas, applying a solder coating to the external contact areas.

22. The method according to claim 19, which comprises using stamping technology to perform the step of introducing the plurality of the through openings for receiving the mechanical clip.

23. The method according to claim 19, which comprises using laser removal to perform the step of introducing the plurality of the through openings for receiving the mechanical clip.

24. A method for producing electronic devices, the method which comprises:

performing the method according to claim 19 for producing the lead frame;

applying a structured double-sided adhesive film to a top side of the lead frame, the double-sided adhesive film having openings in each one of the plurality of the rewiring plates, the double-sided adhesive film being made smaller in each one of the plurality of the rewiring plates than a protective layer configured on an active top side of a respective semiconductor chip;

in each one of the plurality of the rewiring plates, applying an active top side of the respective semiconductor chip to the double-sided adhesive film;

in each one of the plurality of the rewiring plates of the leadframe, producing bonding connections between the rewiring lines on the underside of the lead frame and contact areas on the active top side of the respective semiconductor chip;

applying the plastics compound on the top side of the leadframe to: encapsulate each respective semiconductor chip, fill the bonding channel of each one of the plurality of the rewiring plates, and fill the plurality of the through openings in the edge regions of each one of the plurality of the rewiring plates; and separating the leadframe into individual electronic devices.

25. The method according to claim 24, wherein the step of producing the bonding connections includes bonding line bridges onto the contact areas, the line bridges bridging the bonding channel.

26. The method according to claim 24, wherein the step of producing the bonding connections includes connecting bonding wires between the bonding ends and the contact areas by performing a bonding step selected from a group consisting of thermosonic bonding, ultrasonic bonding, and thermocompression bonding.

27. The method according to claim 24, which comprises applying external contacts to the external contact areas, which are not covered, by soldering solder balls to the underside of the leadframe.

* * * * *